(12) United States Patent
Schulz

(10) Patent No.: US 7,099,010 B2
(45) Date of Patent: Aug. 29, 2006

(54) TWO-DIMENSIONAL STRUCTURE FOR DETERMINING AN OVERLAY ACCURACY BY MEANS OF SCATTEROMETRY

(75) Inventor: Bernd Schulz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 307 days.

(21) Appl. No.: 10/304,028

(22) Filed: Nov. 25, 2002

(65) Prior Publication Data

US 2003/0224261 A1   Dec. 4, 2003

(30) Foreign Application Priority Data

May 31, 2002  (DE) ................ 102 24 164

(51) Int. Cl.
| | |
|---|---|
| G01B 11/00 | (2006.01) |
| G03F 9/00 | (2006.01) |
| G03C 5/00 | (2006.01) |
| H01L 23/544 | (2006.01) |
| H01L 21/76 | (2006.01) |

(52) U.S. Cl. .................. 356/401; 430/22; 430/30; 257/797; 438/401

(58) Field of Classification Search ........ 356/399–401; 257/797; 430/5, 22, 30; 355/53, 55, 77; 250/548

See application file for complete search history.

(56) References Cited

U.S. PATENT DOCUMENTS

| 3,781,014 | A | * | 12/1973 | Kolwicz ................... 273/260 |
|---|---|---|---|---|
| 4,259,682 | A | * | 3/1981 | Gamo ...................... 257/620 |
| 4,475,811 | A | * | 10/1984 | Brunner ................... 355/133 |
| 5,216,257 | A | | 6/1993 | Brueck et al. ............ 250/548 |
| 5,622,796 | A | | 4/1997 | Canestrari et al. ......... 430/22 |
| 5,635,336 | A | * | 6/1997 | Bae .......................... 430/314 |
| 5,677,091 | A | * | 10/1997 | Barr et al. ................ 430/5 |
| 5,715,063 | A | * | 2/1998 | Ota .......................... 356/400 |
| 5,867,276 | A | | 2/1999 | McNeil et al. ............ 356/445 |
| 5,877,860 | A | | 3/1999 | Borden ..................... 356/376 |
| 5,880,838 | A | | 3/1999 | Marx et al. ............... 356/351 |
| 6,051,348 | A | | 4/2000 | Marinaro et al. .......... 430/30 |
| 6,081,334 | A | | 6/2000 | Grimbergen et al. ...... 356/357 |
| 6,130,750 | A | * | 10/2000 | Ausschnitt et al. ........ 356/401 |
| 6,245,584 | B1 | | 6/2001 | Marinaro et al. .......... 438/14 |

(Continued)

FOREIGN PATENT DOCUMENTS

DE    28 19 400 C2    5/1978

(Continued)

OTHER PUBLICATIONS

Stein and Whitefield, "Integral Measurement of Micron Lines on Wafers, Masks and Layers by Using Diffraction," *IBM Technical Disclosure Bulletin*, vol. 24, No. 7A, pp. 3178-3180, Dec. 1981.

*Primary Examiner*—Layla G. Lauchman
*Assistant Examiner*—Gordon J. Stock, Jr.
(74) *Attorney, Agent, or Firm*—Williams, Morgan & Amerson, P.C.

(57) ABSTRACT

A two-dimensional periodic pattern that is symmetrical with respect to a first and a second direction allows the determination of an overlay accuracy that is obtained during the fabrication of the two-dimensional structure. Due to the symmetry of the structure, the overlay accuracy in the first direction may be determined on the basis of substantially the same reference data as used for the determination of the overlay accuracy of the second direction so that establishing libraries is simplified. Moreover, depending on the capability of the metrology tool, the overlay accuracy in both directions may be obtained simultaneously.

20 Claims, 2 Drawing Sheets

U.S. PATENT DOCUMENTS

| | | | |
|---|---|---|---|
| 6,396,569 B1 * | 5/2002 | Zheng et al. | 355/77 |
| 6,433,878 B1 | 8/2002 | Niu et al. | 356/603 |
| 6,573,986 B1 * | 6/2003 | Smith et al. | 356/124 |
| 6,855,464 B1 * | 2/2005 | Niu et al. | 430/5 |
| 2002/0135781 A1 | 9/2002 | Singh et al. | 356/601 |
| 2002/0158193 A1 * | 10/2002 | Sezginer et al. | 250/237 G |
| 2003/0026471 A1 * | 2/2003 | Adel et al. | 382/144 |

FOREIGN PATENT DOCUMENTS

| | | |
|---|---|---|
| DE | 197 36 959 A1 | 8/1997 |
| DE | 199 25 831 A1 | 12/2000 |
| EP | 0 498 006 A1 | 8/1992 |
| JP | 57166034 A | 10/1982 |
| JP | 59004019 A | 1/1984 |
| JP | 08321532 A | 12/1996 |
| JP | 09033213 A | 2/1997 |
| JP | 11191530 A | 7/1999 |

* cited by examiner

TWO-DIMENSIONAL STRUCTURE FOR DETERMINING AN OVERLAY ACCURACY BY MEANS OF SCATTEROMETRY

BACKGROUND OF THE INVENTION

1. Field of the Invention

The present invention relates to the field of fabrication of integrated circuits, and, more particularly, to a method and structure for estimating an overlay accuracy that is obtained in forming successive material layers requiring the alignment of the successive material layers to each other.

2. Description of the Related Art

Fabrication of integrated circuits requires tiny regions of precisely controlled size to be formed in a material layer of an appropriate substrate, typically a silicon substrate. These tiny regions of precisely controlled size are generated by patterning the material layer by performing known photolithography and etching processes, wherein a mask layer is formed over the material layer to be treated to define these tiny regions. Generally, a mask layer may consist of or is formed by means of a layer of photoresist that is patterned by a lithographic process. During the lithographic process, the resist may be spin-coated onto the wafer surface and is then selectively exposed to ultraviolet radiation. After developing the photoresist, depending on the type of resist, positive resist or negative resist, the exposed portions or the non-exposed portions are removed to form the required pattern in the layer of photoresist. Since the dimensions of the patterns in sophisticated integrated circuits are steadily decreasing, the equipment used for patterning device features have to meet very stringent requirements with regard to resolution and overlay accuracy of the involved fabrication processes. In this respect, resolution is considered as a measure specifying the consistent ability to print minimum size images under conditions of predefined manufacturing variations. One important factor in improving the resolution is represented by the lithographic process, in which patterns contained in a photo mask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance, however, is the accuracy with which an image can be positioned on the surface of the substrate. Integrated circuits are fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure and development. Furthermore, non-uniformities of the etching processes can also lead to variations of the etched features. In addition, there exists an uncertainty in overlaying the image of the pattern for the current material layer to the etched pattern of the previously formed material layer while photolithographically transferring the image onto the substrate. Several factors contribute to the ability of the imagery system to perfectly overlay two layers, such as imperfections within a set of masks, temperature differences at the different times of exposure, and a limited registration capability of the alignment tool. As a result, the dominant criteria, determining the minimum feature size that may finally be obtained, are resolution for creating features in individual substrate layers and the total overlay error to which the above explained factors, in particular the lithographic process, contribute.

Therefore, it is essential to steadily monitor the resolution, i.e., the capability of reliably and reproducibly creating the minimum feature size, also referred to as critical dimension (CD), within a specific material layer, and to steadily determine the overlay accuracy of patterns of material layers that have been successively formed and that have to be aligned to each other. Recently, scatterometry has become a powerful tool in characterizing periodic patterns of features with a size in the range of 1 µm to 0.1 µm and less. In analyzing a substrate by scatterometry, the substrate containing a periodic structure is illuminated with radiation of an appropriate wavelength range and the diffracted light is detected to obtain measurement spectra, from which information on the periodic structure may be extracted. Many types of apparatus may be used for illumination and detecting of the diffracted light beam. For example, U.S. Pat. No. 5,867,276 describes a so-called two-$\theta$-scatterometer, wherein the angle of incidence of a light beam is continuously varied by synchronously rotating the sample and the detector. Furthermore, this document describes a scatterometer system utilizing a rotating block to translate a light beam emitted from a light source to different points to the entrance aperture of a lens to illuminate the substrate at different angles of incidence. This document further describes a scatterometer with a fixed angle of incidence that utilizes a multi-wavelength illumination source to obtain the required information from the diffracted multi-wavelength beam. From this information contained in the measurement spectrum, the optical and dimensional properties of the individual elements that form the periodic structure and the thickness of underlying films can be extracted, for example, by statistical techniques. The sample parameters of interest may include the width of lines if the periodic pattern contains lines and spaces, the sidewall angle, and other structural details. In case of a more complex periodic structure having, for example a two-dimensional periodicity, the parameters may include dimensional properties such as hole diameter or depth.

Frequently, metrology tools such as an ellipsometer and the like, are employed as "scatterometers," which emit a substantially linearly polarized light beam, wherein structural information may then be obtained on the basis of changes in the polarization state of the light beams scattered from the periodic structure. Although scatterometry has proven to be a promising candidate in determining structural properties of periodic structures, applying scatterometry to overlay measurements requires the provision of specially designed overlay patterns as well as the establishment of corresponding reference data to extract the required information. In particular, establishing the reference data may be a complex and laborious procedure, since the response of a periodic structure is theoretically derived from the basic equations (Maxwell's equations). Usually, reference data for a specific type of periodic structure or overlay structure is calculated for a variety of different parameter values and is then stored in a so-called library. The measurement data is then compared with the data of the library to extract the required information. Since, generally, a pattern for measurement of overlay accuracy is more complex than a periodic pattern for determining, for example, critical dimensions, great effort is required to establish a corresponding overlay library. A further criterion in determining the overlay accuracy is the floor space that corresponding overlay structures occupy on the substrate. As chip area is very precious, it would be highly desirable to efficiently determine the overlay accuracy without wasting an undue amount of chip area.

In view of the above-mentioned problems, there exists a need for an improved technique for determining the overlay accuracy to thereby simplify the measurement procedure and/or reduce the required chip area occupied by the corresponding structures.

SUMMARY OF THE INVENTION

Generally, the present invention is directed to determining the overlay accuracy of different material layers, which is obtained in aligning these layers during the fabrication of integrated circuits. To this end, a two-dimensional periodic pattern is provided that exhibits substantially the same symmetry in the x- and y-directions so that, with a single and relatively simple overlay structure, the accuracy in the x- and y-directions may be determined, wherein substantially the same library of reference data may be used due to the symmetric design of the overlay structure.

According to one illustrative embodiment of the present invention, a structure for determining an overlay accuracy of at least two successively formed patterns comprises a substrate having formed thereon a plurality of first and second regions, wherein the first and the second regions are arranged to form a periodic pattern having a predefined first periodicity along a first direction and along a second direction. Moreover, the structure comprises a plurality of third regions, each of which overlaps one of the second regions such that the plurality of third regions form a predefined second periodicity along the first and the second directions, wherein a pitch of the third regions is substantially equal to a pitch of the periodic pattern.

According to a further illustrative embodiment of the present invention, a substrate comprises a plurality of chip areas and at least one structure for determining an overlay accuracy of a first pattern and a second pattern formed on the substrate in a spatial relationship to each other. The structure includes a plurality of first and second regions, wherein the first and second regions are arranged to form a periodic pattern having a predefined first periodicity along a first direction and along a second direction. A plurality of third regions is also provided, each of which overlaps one of the second regions such that the plurality of third regions form a predefined second periodicity along the first and the second directions.

According to a further illustrative embodiment of the present invention, a method of forming a semiconductor device including a structure for determining an overlay accuracy comprises forming a first material layer on a surface of a substrate, wherein the first material layer includes a plurality of first regions of a first optical characteristic and second regions of a second optical characteristic. The first and second regions are arranged so as to form a two-dimensional periodic pattern with a predefined periodicity along a first direction and a second direction that are substantially parallel to the surface. The method further comprises aligning the substrate with respect to a second material layer to be formed on the substrate, and forming the second material layer. The second material layer includes a plurality of third regions, wherein each of the third regions overlies one of the second regions such that a relative position of the third region with respect to the underlying second region is indicative of the overlay accuracy of the first and the second material layers with respect to the first and the second directions.

According to yet a further illustrative embodiment of the present invention, a method of monitoring an overlay accuracy in manufacturing a device having patterned layers comprises identifying a structure including a two-dimensional periodic pattern, wherein a periodicity along a first direction is substantially equal to the periodicity along a second direction. The structure further includes a second periodic pattern formed in a different material layer and exhibiting a spatial relationship, wherein the second periodic pattern exhibits a second periodicity along the first and the second directions, wherein a pitch of the second periodic pattern is substantially equal to a pitch of the first periodic pattern. The method further comprises directing a first light beam onto the structure under an angle of incidence such that a portion of the first light beam is reflected to form a first reflected light beam, wherein the first light beam and the first reflected light beam form a plane of incidence that is substantially parallel to the first direction. Moreover, the first reflected light beam is detected to obtain a first measurement data and an overlay accuracy, with respect to the first direction, is estimated on the basis of the first measurement data and a reference data. A second light beam is directed onto the structure under an angle of incidence such that a portion of the second light beam is reflected to form a second reflected light beam, wherein the second light beam and the second reflected light beam form a plane of incidence that is substantially parallel to the second direction. The second reflected light beam is then detected to obtain a second measurement data on the basis of which an overlay accuracy, with respect to the second direction, is estimated by using the reference data.

BRIEF DESCRIPTION OF THE DRAWINGS

The invention may be understood by reference to the following description taken in conjunction with the accompanying drawings, in which like reference numerals identify like elements, and in which.

Figure 1:
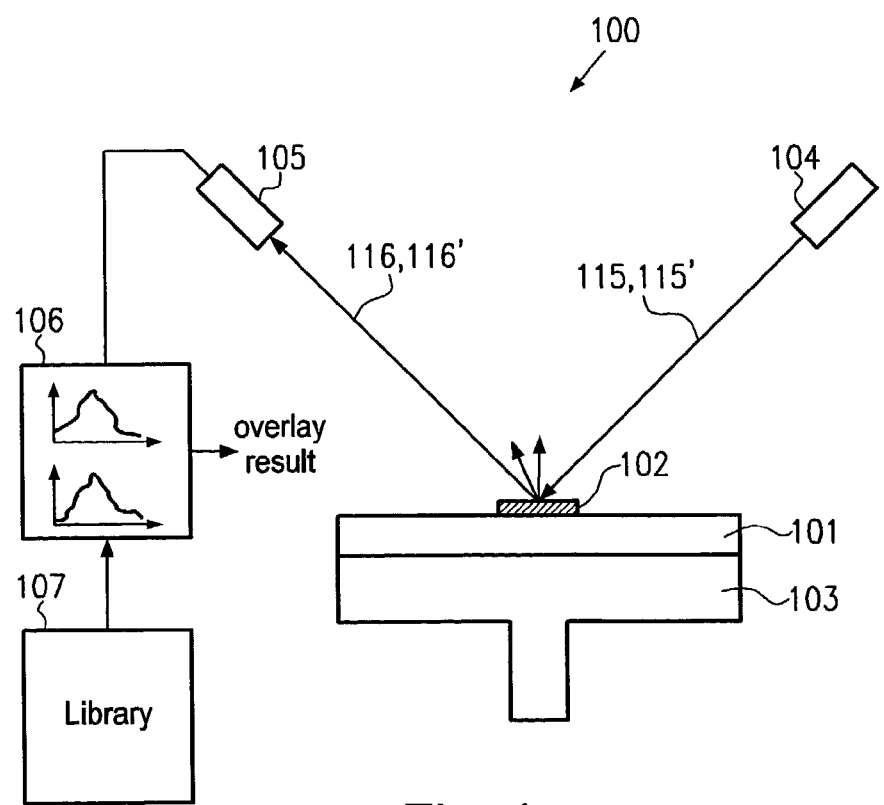
FIG. 1 schematically shows a metrology system adapted to perform an overlay accuracy measurement in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As previously explained, a light beam, diffracted by a periodic pattern, exhibits an intensity distribution with respect to one or more characteristics of the light beam, such as direction of polarization, angle of deflection, and the like, which strongly depends on the diffracting characteristics of the periodic pattern. This property is exploited to monitor, for example, critical dimensions of circuit features within a specific process level. By combining two periodic patterns that are formed in different material layers and thus bear a certain spatial relationship to each other, a combined periodic pattern is created, in which at least one typical characteristic may depend on the degree of alignment obtained during the formation of the first and second periodic patterns. For example, if the first and second periodic structures are designed such that an asymmetric response is obtained upon a deviation of the overlay accuracy from a target position with respect to a specified direction, not only the magnitude of the deviation may be detected but also the sign of the deviation, with respect to the target value, may be determined. The response of a periodic pattern to an incident light beam of well-defined optical characteristics depends on the properties of the periodic pattern and may be calculated from the basic physical equations describing the interaction of electromagnetic radiation with matter (Maxwell's equations). To extract minute differences of the overlaid periodic patterns, a large amount of computational power is required and commonly the calculations are done in advance to create reference data, which is stored in so-called libraries. Each library corresponds to a specified type of periodic pattern. It may, therefore, be of great advantage to provide for the possibility to perform measurements on overlay accuracy with a minimum number of libraries that have to be created for the measurement.

Figure 2:
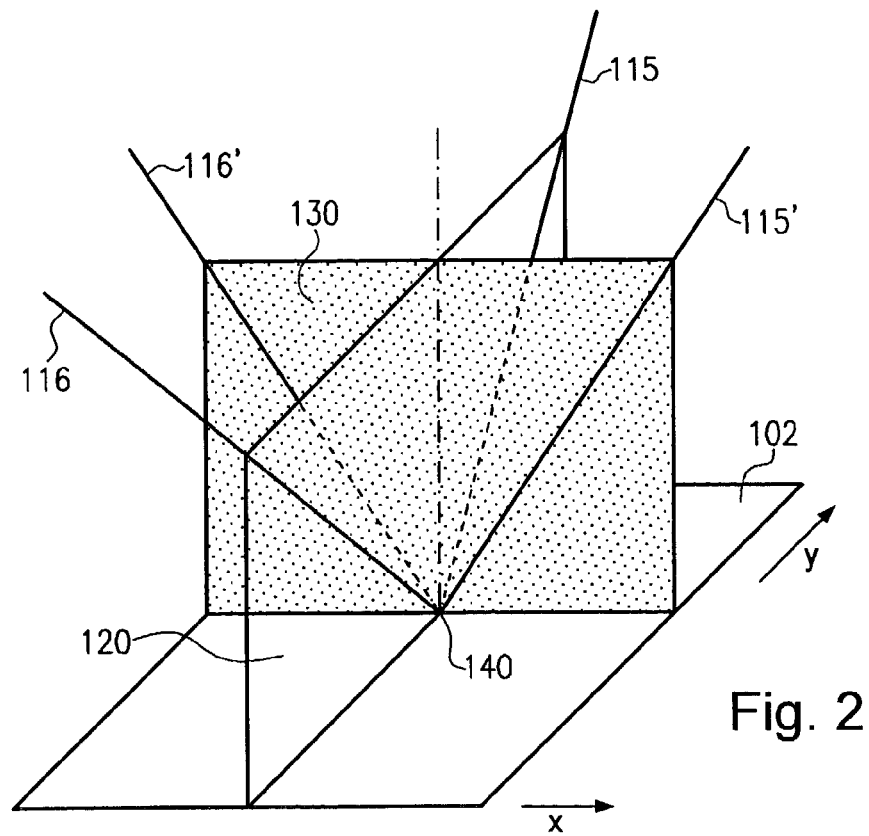
FIG. 2 schematically shows the arrangement of measurement light beams with respect to a substrate to be examined according to a further illustrative embodiment of the present invention.

With reference to FIGS. 1–3, illustrative embodiments of the present invention will now be described in more detail. FIG. 1 schematically shows a metrology tool 100 that is adapted to perform measurements on overlay accuracy of material layers successively formed on a substrate 101. The substrate 101 may be any type of substrate requiring the successive formation of patterned material layers thereon. Within the scope of this application, two successively formed material layers may not necessarily be two distinguishable material layers stacked on top of each other, such as a semiconductor substrate bearing defined tiny regions on top of which a new material is deposited and patterned to be in a defined spatial relationship with the underlying tiny region. Rather, an underlying material may be subjected to a further patterning process, for example, certain areas of the material layer may be appropriately masked to receive implanted ions to form doped regions within the material layer. Thus, although the material layer, including the doped regions, may be considered as a single material layer, in the present application, the initial structured material layer will be referred to as a first material layer and the plurality of doped regions, patterned within the first material layer by means of a mask layer, will be referred to as a second material layer. The same holds true for any "sub-structure" formed in an initial patterned material layer, as is the case, for example, by etching a further pattern into the initial patterned layer.

The substrate 101 comprises a measurement structure 102 at a predefined location of the substrate 101. In one particular embodiment, the measurement structure 102 represents a structure that is formed during the various stages of the manufacturing of integrated circuits so that overlay accuracy during the various process stages may be monitored. The substrate 101 may be supported by a substrate holder 103, wherein the substrate holder 103 may be adapted to receive, convey and hold the substrate 101 in position during the measurement. Moreover, a light source 104 is provided and configured to emit a light beam of suitable optical characteristics to be used for scatterometry. It is to be noted that the term "light beam" refers to any type of radiation within a suitable wavelength range and is thus not limited to the visible wavelength spectrum. In particular, the light source 104 may be adapted to emit radiation in the ultraviolet, infrared, x-ray and microwave range.

A detector 105 is arranged to receive a light beam reflected from the surface of the substrate 101. It should be noted that available metrology systems, such as an ellipsometer and the like, may be used to provide for the substrate holder 103, the light source 104 and the detector 105. The detector 105 is operatively coupled to a control unit 106 configured to receive an output signal from the detector 105 and to receive a signal representing reference data from storage means 107. The control unit 106 may be further adapted to process the received signals from the detector 105 and the storage means 107 so as to output a result regarding the comparison of the detector signal and the reference data.

Figure 3A:
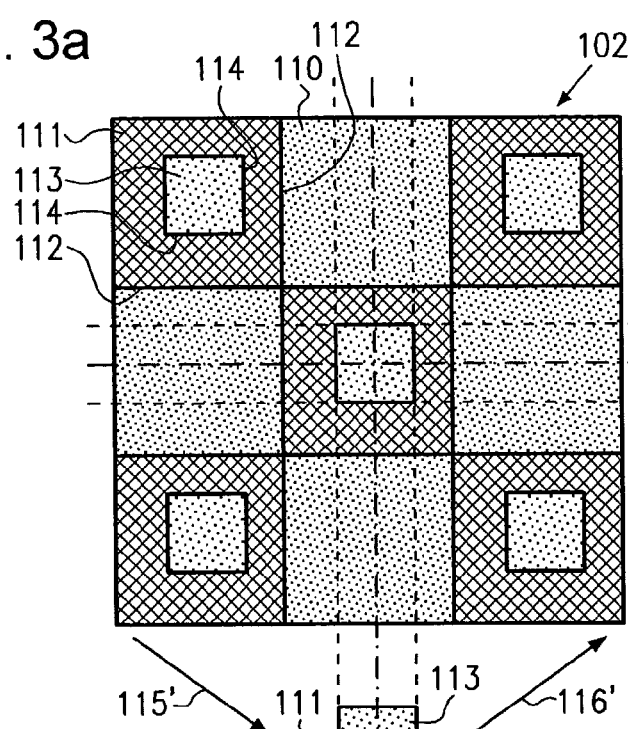
FIGS. 3*a*–3*c* schematically show a top view and cross-sectional view of a structure according to one particular embodiment of the present invention that is appropriate to determine an overlay accuracy in two orthogonal directions.
Figure 3B:
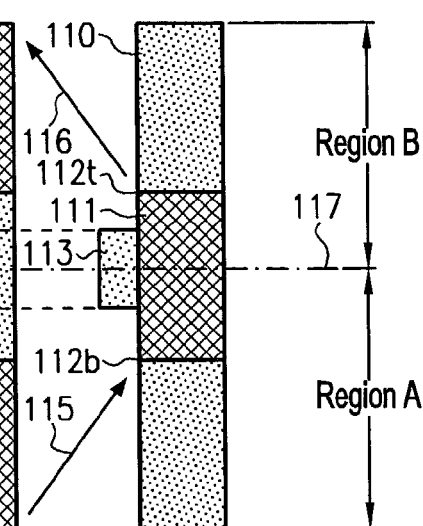
Figure 3C:
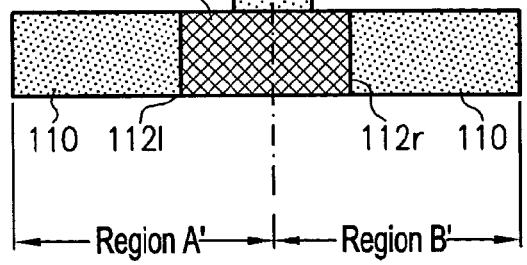
Figure 3C:
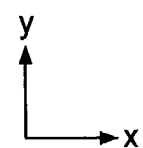

Referring now to FIGS. 3a–3c, the measurement structure 102 will be described in more detail. FIG. 3a shows a schematic top view of a portion of the measurement structure 102. As indicated in the drawing, a first direction, also referred to as x-direction, and a second direction, also referred to as y-direction, are defined substantially parallel to the surface of the measurement structure 102. First regions 110 and second regions 111 are arranged adjacent to one another to form a first material layer—in the sense of the above definition—wherein a periodicity defined by the alternating first and second regions 110, 111 along the x-direction is substantially equal to a periodicity defined along the y-direction. The first regions 110 and the second regions 111 differ from each other by at least one optical characteristic so as to define a transition region 112 between the first and the second regions 110 and 111. Although the first and second regions are depicted as squares, other appropriate geometric forms may be selected as long as a symmetry that maps the x-direction into the y-direction is obtained. In other embodiments, first and second regions 110, 111 may be of regular polygonal shape exhibiting the required symmetry or may be of annular shape. In view of modeling the measurement structure 102 to create reference data, the highly symmetrical and simple structure, as shown in FIG. 3a, may be preferable.

In or on each of the second regions 111, a third region 113 is formed, the plurality of third regions 113 forming a second material layer in the above-defined sense. Thus, the third regions 113 may represent a different material formed in the second region 111, for example, by filling in a material in a recess formed in the second region 111, or the third region 113 may represent a region that differs in at least one characteristic compared to the surrounding second region 111, for example, a dopant concentration of the second region 111 and the third region 113 may differ from each other, or a third region 113 may be formed on top of the second region 111 as is depicted in the cross-sectional views of FIGS. 3b and 3c. The plurality of third regions 113 defines a second periodicity in the x- and y-directions. Each of the third regions 113 exhibits the same symmetry with respect to a rotation mapping the x-direction into the y-direction as the first and second regions 110, 111. Regarding the shape of the third regions 113, the same criteria apply as explained above with reference to the first and second regions 110, 111. The third regions 113 may differ from the second regions 111 by size and/or optical characteristics so as to form a transition region 114 to the second region 111. In one particular embodiment, the dimensions of the third regions 113 are selected in such a way that, for any practical misalignment during the formation of the first material layer and the second material layer, the third region 113 does not overlap the transition region 112.

In one embodiment, the third region 113 is dimensioned so that, for a given maximum overlay error and a given size of the second region 111, the transition region 114 is located on the transition region 112 when the maximum overlay error occurs.

FIG. 3b depicts a cross-sectional view taken along the y-direction. Arrows 115 and 116 define an approximate angle of incidence and an angle of reflection, respectively, so that a general direction of propagation is determined, which in the present case is from bottom to top. Accordingly, the first material layer formed by the first regions 110 and the second regions 111 comprises in the direction of propagation a transition region 112B having a transition of the optical characteristic of the first region 110 to that of the second region 111. Similarly, a transition region 112T exhibits a transition of the optical characteristics having a discontinuity from the second region 111 to the first region 110. For example, the first region 110 may be represented by a space area, i.e., by a recessed area, compared to a line area, representing the second region 111. That means the transition 112B represents a transition from the bottom of the recessed region 110 to the top of the region 111, while the transition region 112T represents a step from the top of the region 111 to the bottom of the region 110. Thus, if the center of the second region 111 is considered as a reference point, as indicated by 117, the area extending downward from reference point 117 determines a region A, and the area extending upward from reference point 117 determines a region B, wherein the regions A and B form a periodic pattern in the y-direction. The regions A comprise the transition region 112B, whereas the regions B comprise the transition region 112T. In FIG. 3b, a third region 113 forming the second material layer may be designed, in this example, such that an overlay error of "0" corresponds to a position of the third region 113 with its center point positioned on the reference point 117. However, any other choice for the "0" overlay error position may be appropriate, whereas centering the middle of the third region 113 at the reference point 117 ensures a maximum sensitivity both in the positive and negative direction of the y-direction. Thus, the degree of deviation of the third region 113 with respect to the reference point 117, i.e., the overlay accuracy of the second material layer with respect to the first material layer, is correlated to the response of the regions A and B to the incoming light beam 115. For example, a displacement of the third region 113 in the direction of the general propagation direction of the light beam 115 will result in region A in an increased uncovered area of the second region 111, whereas in region B the uncovered portion of the second region 111 is decreased.

In FIG. 3c, a cross-sectional view taken along the x-direction is shown. Since the measurement structure 102 is symmetrical with respect to a rotational axis that maps the x-direction into the y-direction, the explanations given with reference to FIG. 3b analogously apply to FIG. 3c. In this view, transition regions 112L, 112R correspond to transition regions 112B, 112T, respectively. It is thus evident that any displacement of the third regions 113 in the x- and/or y-direction leads to a corresponding variation of the regions A and B (or A' and B') and thus influences the response of a light beam, the plane of incidence of which is parallel to the respective direction. That is, a light beam propagating corresponding to arrows 115 and 116 will be affected by any displacement along the y-direction, and the resulting reflected beam 116 will contain information on the magnitude as well as on the sign of the displacement. Similarly, a light beam incident along the arrow 115' and reflected along the arrow 116' will be influenced by a displacement along the x-direction and the reflected light beam 116' will include information regarding the magnitude and the sign of the displacement in the x-direction. Moreover, as is evident from FIG. 3a, the displacements in the x-direction and y-direction are substantially independent from each other, since, for example, a displacement in the y-direction will substantially not affect the characteristics of the measurement structure 102 for a light beam having a plane of incidence parallel to the x-direction.

During operation of the metrology system 100 of FIG. 1, the light source 104 emits the light beam 115 with the substrate 101 oriented such that the beam 115 impinges on the measurement structure 102 in a way that a plane of incidence defined by the beam 115 and the reflected beam 116 is substantially parallel to the y-direction. As explained above, the reflected light beam 116 carries the information relating to the overlay accuracy according to the y-direction, and the output signal of the detector 105, also including this information, is supplied to the control unit 106. In control unit 106, the output signal of the detector 105 is compared to reference data provided in storage means 107 to output the result of the overlay measurement regarding the y-direction. Depending on the type of metrology tool 100, the light beam 115 is directed onto the measurement structure 102 so that the plane of incidence defined by the beam 115' and the reflected beam 116' is substantially parallel to the x-direction. This may be accomplished by rotating the substrate holder 103 and/or the light source 104 and the detector 105. If the metrology tool 100 is equipped with means allowing for the provision of the light beams 115 and 115' simultaneously and the detection of the reflected light beams 116 and 116' simultaneously, the control unit 106 is then preferably adapted to receive the output signals referring to the reflected light beams 116 and 116' simultaneously.

FIG. 2 schematically shows the spatial relationship between the light beams 115, 115' and the reflected light beams 116 and 116' and the measurement structure 102. As is evident from FIG. 2, the light beam 115 and the reflected light beam 116, which includes information on the optical characteristics of the measurement structure 102 along the y-direction, define a first plane of incidence 120, whereas the light beam 115' and the corresponding reflected light beam 116', detecting the optical characteristics of the measurement structure 102 along the x-direction, define a second plane of incidence 130. Preferably, the light beams 115 and 115' are directed to the measurement structure 102 in such a way that they substantially intersect at a single point 140 at the surface of the measurement structure 102. It should be noted that, in reality, the light beams 115 and 115' create a light spot on the measurement structure 102, the size of which depends on the optical characteristics of the light source 104. Typically, the light source 104 provides light beams 115, 115' having a spot diameter at the surface of the measurement structure 102 that is well within the periodic patterns formed on the measurement structure 102 so that substantially the entire area of the light spot, formed by the beams 115, 115', contributes to the measurement without unduly creating any edge effects occurring when the light beams 115, 115' would exceed the dimensions of the measurement structure 102. As previously mentioned, if the metrology tool 100 is appropriately equipped, the light beams 115, 115' may be simultaneously emitted and the reflected light beams 116 and 116' may simultaneously be detected. Otherwise, an additional alignment step is required after rotating the substrate 101 or the light source 104 and detector 105 from the x-direction to the y-direction and vice versa.

As a result, the present invention allows determination of the overlay accuracy with a single measurement structure of high simplicity, so that a generation of an according library is relatively simple and wherein substantially the same library may be used for both directions due to the high symmetry of the periodic pattern. Moreover, a single measurement structure is sufficient to determine the overlay accuracy in two linearly independent directions, thereby saving on chip area.

In one embodiment, the substrate 101 comprises a plurality of dies which are separated by scribe lines, wherein the measurement structure is located in at least one scribe line. In another embodiment, a circuit pattern may be identified that approximately exhibits a periodicity and symmetry as described above. This pattern may then be used to determine the overlay accuracy without requiring the design of special lithographic masks including specific measurement structures.

In one embodiment, the present application discloses a substrate comprised of a semiconductor material comprising a plurality of chip areas and at least one structure for estimating an overlay accuracy in forming successive material layers on the substrate, the structure including a plurality of first and second regions, wherein the first and the second regions differ from each other in at least one of type of material and surface topology, the first and second regions arranged to form a periodic pattern having a predefined first periodicity along a first direction and along a second direction, and a plurality of a third regions, each of which overlies one of the second regions so as to exhibit a predefined second periodicity along the first and the second directions. In some cases, at least some of the chip areas are separated from each other by scribe lines and the at least one structure is located in at least one of the scribe lines. In other cases, the at least one structure is located in at least one chip area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A structure for estimating an overlay accuracy in forming successive material layers on a substrate during the course of manufacture of integrated circuit devices, the structure comprising:
    a substrate comprised of a semiconductor material having formed thereon a plurality of first and second regions, wherein the first region and the second region differ from each other in at least one of type of material and surface topology, the first and the second regions arranged to form a periodic pattern having a predefined first periodicity along a first direction and along a second direction; and
    a plurality of third regions, each of which overlies one of said second regions so as to exhibit a predefined second periodicity, with a pitch that is substantially equal to a pitch of said periodic pattern, along the first and the second directions, wherein the size of the first, the second and the third regions is selected so that each third region lies within the respective second region for a given maximum overlay inaccuracy.

2. The structure of claim 1, wherein the second and the third regions differ from each other in at least one of type of material and surface topology.

3. The structure of claim 1, wherein the first and second regions are substantially equally sized squares.

4. The structure of claim 1, wherein each of the first, second and third regions is enclosed by a perimeter region.

5. The structure of claim 4, wherein said perimeter region defines a regular polygonal shape.

6. A method of forming a semiconductor device, including a structure for determining an overlay accuracy, the method comprising:
    forming a first material layer on a surface of a substrate, the first material layer including a plurality of first regions of a first optical characteristic and a plurality of second regions of a second optical characteristic, wherein the first and the second regions differ from each other in at least one of type of material and surface topology, the first and second regions arranged to form a two-dimensional periodic pattern with a predefined periodicity along a first direction and a second direction that are substantially parallel to said surface;
    aligning said substrate with respect to a second material layer to be formed; and
    forming said second material layer, the second material layer including a plurality of third regions, each of the third regions partially covering a respective one of said second regions, wherein a relative position of the third region with respect to the second region is indicative of the overlay accuracy of the first and second material layers with respect to the first and second directions.

7. The method of claim 6, wherein a size of the first, the second and the third regions is selected so that each third region is formed within the respective second region for a given maximum overlay inaccuracy.

8. The method of claim 6, wherein each of the first, second and third regions is enclosed by a perimeter region defining a shape that is symmetrical with respect to a transformation which maps the first direction into the second direction.

9. The method of claim 6, wherein the second and the third regions differ from each other in at least one of type of material and surface topology.

10. A method of monitoring an overlay accuracy in manufacturing a semiconductor device, the method comprising:
    identifying a structure including a plurality of first and second regions, wherein the first and the second regions differ from each other in at least one of type of material and surface topology, the first and second regions arranged to form a periodic pattern having a predefined first periodicity along a first direction and along a second direction, a plurality of third regions, each of which overlies one of said second regions so as to exhibit a predefined second periodicity along the first and the second directions;
    directing a first light beam onto said structure under an angle of incidence such that a portion of the first light beam is reflected to form a first reflected light beam, wherein the first light beam and the first reflected light beam form a plane of incidence that is substantially parallel to said first direction;
    detecting said first reflected light beam to obtain a first measurement data;
    estimating an overlay accuracy with respect to said first direction on the basis of the first measurement data and reference data;
    directing a second light beam onto said structure under an angle of incidence such that a portion of the second reflected light beam is reflected to form a second reflected light beam, wherein the second light beam and the second reflected light beam form a plane of incidence that is substantially parallel to the second direction;
    detecting said second reflected light beam to obtain a second measurement data; and
    estimating an overlay accuracy with respect to the second direction on the basis of the second measurement data and reference data.

11. The method of claim 10, wherein said first and second light beam are substantially simultaneously directed onto said structure.

12. The method of claim 10, wherein directing said second light beam includes rotating at least one of said substrate and a light source.

13. The method of claim 10, wherein said reference data for estimating an overlay accuracy with respect to the first direction is substantially the same as for estimating an overlay accuracy with respect to the second direction.

14. A substrate comprised of a semiconductor material comprising a plurality of chip areas and at least one structure for estimating an overlay accuracy in forming successive material layers on said substrate, said structure including a plurality of first and second regions, wherein the first and the second regions differ from each other in at least one of type of material and surface topology, the first and second regions arranged to form a periodic pattern having a predefined first periodicity along a first direction and along a second direction, and a plurality of a third regions, each of which overlies one of the second regions so as to exhibit a predefined second periodicity along the first and the second directions, and wherein at least some of said chip areas are separated from each other by scribe lines and said at least one structure is located in at least one of the scribe lines.

15. A structure for estimating an overlay accuracy in forming successive material layers on a substrate, the structure comprising:
    a substrate having formed thereon a plurality of first and second regions, the first and the second regions arranged to form a periodic pattern having a predefined first periodicity along a first direction and along a second direction; and
    a plurality of third regions, each of which overlies one of said second regions so as to exhibit a predefined second periodicity, with a pitch that is substantially equal to a pitch of said periodic pattern, along the first and the second directions, wherein the size of the first, the second and the third regions is selected so that each third region lies within the respective second region for a given maximum overlay inaccuracy.

16. The structure of claim 15, wherein the second and the third regions differ from each other in at least one of type of material and surface topology.

17. The structure of claim 15, wherein the first and second regions are substantially equally sized squares.

18. A method of forming a semiconductor device, including a structure for determining an overlay accuracy, the method comprising:
    forming a first material layer on a surface of a substrate, the first material layer including a plurality of first regions of a first optical characteristic and a plurality of second regions of a second optical characteristic, the first and second regions arranged to form a two-dimensional periodic pattern with a predefined periodicity along a first direction and a second direction that are substantially parallel to said surface;
    aligning said substrate with respect to a second material layer to be formed; and
    forming said second material layer, the second material layer including a plurality of third regions, each of the third regions partially covering a respective one of said second regions, wherein a relative position of the third region with respect to the second region is indicative of the overlay accuracy of the first and second material layers with respect to the first and second directions, wherein a size of the first, the second and the third regions is selected so that each third region is formed within the respective second region for a given maximum overlay inaccuracy.

19. The method of claim 18, wherein each of the first, second and third regions is enclosed by a perimeter region defining a shape that is symmetrical with respect to a transformation which maps the first direction into the second direction.

20. The method of claim 18, wherein the second and the third regions differ from each other in at least one of type of material and surface topology.

* * * * *